(12) United States Patent
Ioannou et al.

(10) Patent No.: US 7,180,135 B1
(45) Date of Patent: Feb. 20, 2007

(54) DOUBLE GATE (DG) SOI RATIOED LOGIC WITH INTRINSICALLY ON SYMMETRIC DG-MOSFET LOAD

(75) Inventors: Dimitris E. Ioannou, Fairfax, VA (US);
Souvick Mitra, Burlington, VT (US);
Akram Salman, Sunnyvale, CA (US)

(73) Assignee: George Mason Intellectual Properties, Inc., Fairfax, VA (US)

( * ) Notice: Subject to any disclaimer, the term of this patent is extended or adjusted under 35 U.S.C. 154(b) by 166 days.

(21) Appl. No.: 10/951,695

(22) Filed: Sep. 29, 2004

Related U.S. Application Data (60) Provisional application No. 60/508,276, filed on Oct. 6, 2003.

(51) Int. Cl.
*H01L 27/01* (2006.01)

(52) U.S. Cl. ............... 257/347; 257/369; 361/245
(58) Field of Classification Search ............ 257/347, 257/369, E27.112, E21.32, E21.561; 361/245
See application file for complete search history.

(56) References Cited

U.S. PATENT DOCUMENTS

2006/0012405 A1* 1/2006 Martins .............. 327/77

* cited by examiner

*Primary Examiner*—Douglas W. Owens
(74) *Attorney, Agent, or Firm*—David G. Grossman (57) ABSTRACT

Disclosed is a Silicon-On-Insulator (SOI) Metal-Oxide Semiconductor Field-Effect Transistor (MOSFET) logic family composed of ratioed logic with intrinsically "on" symmetric fully depleted double-gate (DG) SOI MOSFET load(s) and asymmetric fully depleted double gate MOSFET driver(s).

21 Claims, 13 Drawing Sheets

Prior Art

FIG. 1

Prior Art

DOUBLE GATE (DG) SOI RATIOED LOGIC WITH INTRINSICALLY ON SYMMETRIC DG-MOSFET LOAD

CROSS-REFERENCE TO RELATED APPLICATIONS

The present application claims the benefit of provisional patent application: Ser. No. 60/508,276 to Sharif et al, filed on Oct. 6, 2003, entitled "Double Gate (DG) SOI ratioed logic with intrinsically on symmetric DG-MOSFET Load," which are hereby incorporated by reference in its entirety.

The present invention was made with government support under grant number ECS-9900464 awarded by the National Science Foundation. The government may have certain rights in the invention.

BACKGROUND OF THE INVENTION

The present invention relates to the field of Silicon-On-Insulator (SOI) Metal-Oxide Semiconductor Field-Effect Transistor (MOSFET) circuitry. In particular, the present invention involves ratioed logic with intrinsically ON symmetric double-gate (DG) SOI MOSFET loads.

Over the last few years, researchers have investigated DG SOI MOSFET designs as enabling Silicon (Si) devices for the 0.05 µm node and beyond. As a result, a number of DG structures have been proposed and analyzed. Many of these structures have been categorized as symmetric (SDG), where both gates are made of the same polysilicon type (usually $n^+$), and asymmetric (ADG), where one gate is n+ and the other gate is p+ type polysilicon. The n+ gate SDG is usually a "normally on" device having a negative threshold voltage. Therefore, one may need to use exotic gate materials (such as metal gates with appropriate work function values), which may require expensive and complicated processing steps.

Figure 1:
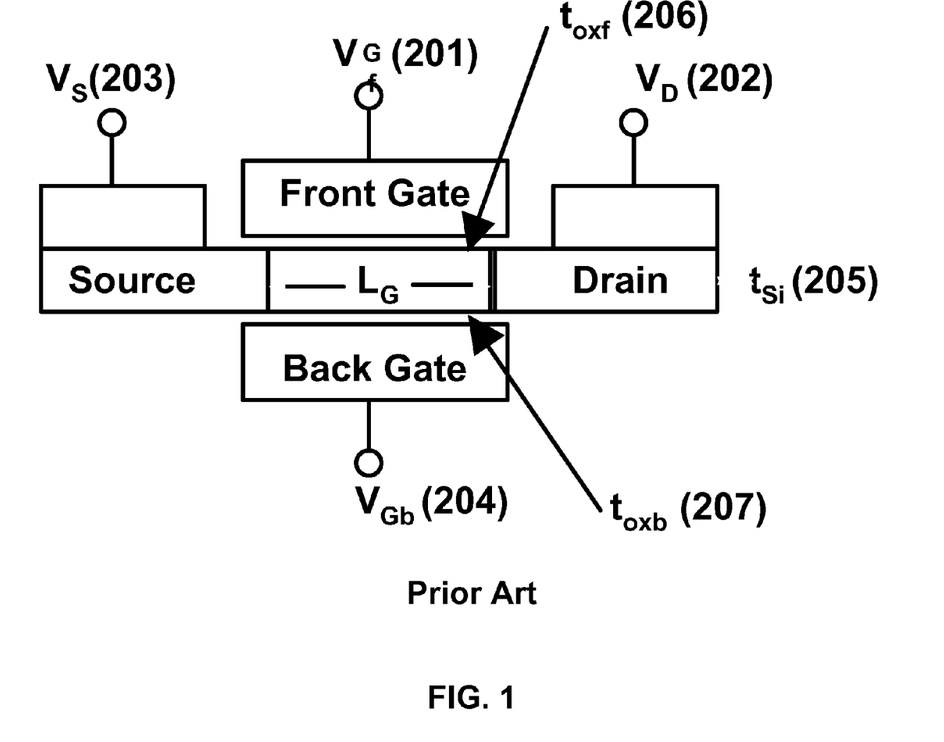
FIG. 1 shows a block diagram of a basic Double Gate (DG) structure. (prior art).

Referring to FIG. 1, we see an example of such a basic Double Gate (DG) structure. As illustrated, one can see basic elements of the structure including: a source, drain, front gate, and back gate. The channel length is shown as LG. Different node voltages shown include: front gate voltage 201; drain voltage 202; source voltage 203, and back gate voltage 204. Also illustrated are several thicknesses, including silicon thickness ($t_{Si}$) 205, front gate oxide thickness ($t_{oxf}$) 206, and back gate oxide thickness ($t_{oxb}$) 207. Designs using SDG gates often require fine-tuning an SDG gate using expensive and complicated processing techniques. For this and other reasons, designs implementing ADG devices have been favored.

Figure 2:
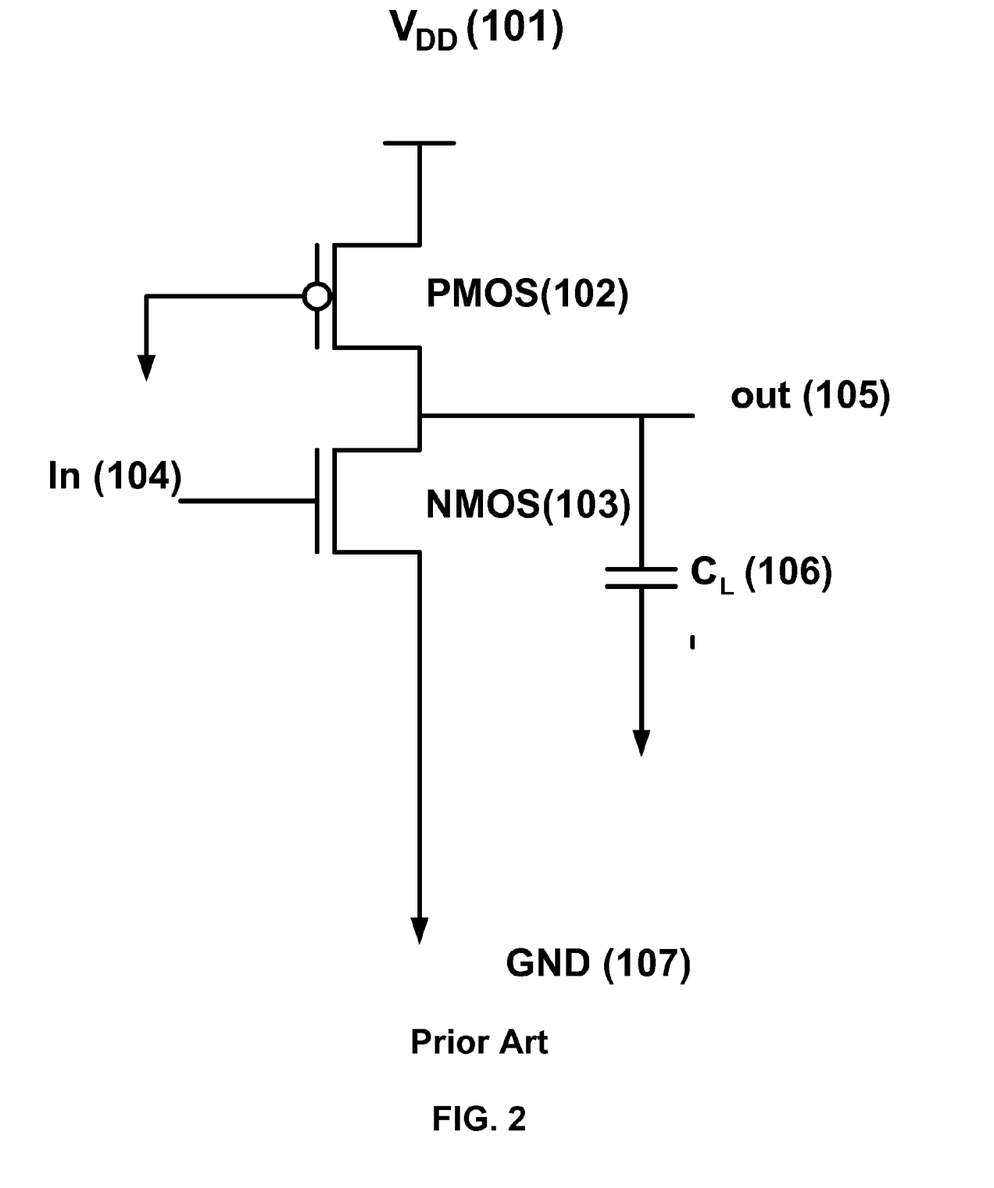
FIG. 2 shows a block diagram of a basic pseudo-nMOS/ratioed logic. (prior art).

FIG. 2 shows a basic Pseudo-nMOS logic design, in which both PMOS and NMOS transistors are combined to produce logic elements. In this exemplary inverter design, PMOS gate 102 is tied to ground 107 and has its source tied to $V_{DD}$ 101. NMOS gate 103 is tied to input 104, and its source is tied to GND 107. The junction of PMOS 102 drain and NMOS 103 source forms the output 105. $C_L$ 106 is the load capacitance. Pseudo-nMOSFET or ratioed logic designs have been known to be fast and small and offer small parasitic capacitance (hence a smaller load). The main drawback of these pseudo-nMOS designs have been their consumption of high static power. [See Jan. M. Rabaey, "Digital Integrated Circuit: A Design Perspective," Prentice Hall, 1996; D. Radhakrishnan, "Design of CMOS Circuits," IEEE Proceedings-G, Vol 138, No. 1, p 83, February 1991.] With the advent of CMOS logic and the growing need for lower power circuits, pseudo-nMOS/ratioed design style fell out of favor with designers and are starting to be seen only in critical path elements where speed and area are at a premium. [See N. H. E. Weste and K. Esraghian, "Principles of CMOS VLSI Design," Addison Wesley, 1993.] Now, as SOI is becoming the base of mainstream technology, design constraints are changing. SOI may offer low junction capacitance. Demonstrations have shown that pseudo-nMOS/ratioed logic on SOI technology may offer significant performance and area improvements. Thus, pseudo-nMOS/ratioed logic on SOI may be used widely in SOI custom-integrated circuits.

As the search for smaller and faster circuits is growing, the much-needed continuous thrust for device scaling in meeting performance and power consumption criteria in Ultra Large Scale Integration (ULSI) circuits is pushing the conventional bulk CMOS technology towards its fundamental physical limits. As device dimensions shrink to submicron and below, limitations of bulk CMOS technology are becoming more pronounced due to strong short-channel effect (SCE) and possible quantum phenomenon, causing performance limitations and degradation. Because of their near-ideal intrinsic features, DG fully depleted SOI MOSFETs may be a better technology choice for the cutting edge nano-scale circuits. In addition to its inherent robustness to the SCEs and naturally steep subthreshold slope, DG MOSFETs may also be capable of offering higher drive current and transconductance. These devices are vigorously researched and evolving. Most structures commonly categorized as symmetric (SDG) have both gates made of the same polysilicon type (usually n+). Most structures commonly categorized as asymmetric (ADG) have one n+ gate and p+ type polysilicon gate.

Despite so much interest in DG SOI devices, there are few reports on circuit applications using these devices. There are reports that discuss the circuits use of DG SOI devices, but those are based on a straightforward mapping of bulk devices or using the CMOS blocks. CMOS-based logics are not good when considering dynamic power dissipation problems, which are prominent factors compared to static power at high frequency operation. CMOS-based logic also suffer from the larger number (2n) of devices problem.

What is needed is a new DG SOI gate construction that has speed and power advantages over regular CMOS gates. Preferably, this new gate construction will be a flexible building block capable of being used to construct a set of basic logic operations with a minimal number of devices.

BRIEF SUMMARY OF THE INVENTION

One advantage of this invention is that only one type of diffusion (nMOSFET) may be needed for constructing basic devices such as inverters, wherein traditional CMOS devices require both (n and p) type diffusion.

Another advantage of the present invention is that it may require only a simple dual poly (n+/p+) process in fabricating gates.

A further advantage of this invention is that it may provide for faster response characteristics at higher frequencies than equivalent CMOS devices.

A further advantage of this invention is that it may provide for devices that dissipate less power than equivalent CMOS devices.

A further advantage of this invention is that it may require fewer devices to build more complex multi-input gates without performance penalties.

A further advantage of this invention is that it may take advantage of the "normally on" state of an SDG gate.

To achieve the foregoing and other advantages, in accordance with all of the invention as embodied and broadly described herein, is an SOI MOSFET inverter comprising a multitude of terminals including an SDG load structure and an ADG load structure. The multitude of terminals may include an input terminal; an output terminal; a supply voltage terminal; and a ground terminal. The SDG load structure may include a first SDG junction having an n+ area connected to the supply voltage terminal; a second SDG junction having an n+ area connected to the output terminal; a first SDG gate having an n+ polysilicon area connected to the output terminal; and a second SDG gate having an n+ polysilicon area connected to the output terminal. The ADG load structure may include a first ADG junction having an n+ area connected to the ground terminal; a second ADG junction having an n+ area connected to the output terminal; a first ADG gate having an n+ polysilicon area connected to the input terminal; and a second ADG gate having an p+ polysilicon area connected to the input terminal. Preferably, the SDG load structure and the ADG load structure are constructed to satisfy an SDG load inverter ratio. Further, a load capacitor may be connected between the ground terminal and the output terminal. Both the ADG driver structure and the SDG load structure may be fabricated on the same substrate, may have buried gates, and may be fabricated using a dual poly process.

In yet a further aspect of the invention, a two input SOI MOSFET NOR circuit is disclosed which includes a multitude of terminals, an SDG load structure, and an ADG load structure. The terminals may include a first input terminal; a second input terminal; an output terminal; a supply voltage terminal; and a ground terminal. The SDG load structure may include a first SDG junction having an n+ area connected to the supply voltage terminal; a second SDG junction having an n+ area connected to the output terminal; a first SDG gate having an n+ polysilicon area connected to the output terminal; and a second SDG gate having an n+ polysilicon area connected to the output terminal. The ADG load structure may include a first ADG junction having an n+ area connected to the ground terminal; a second ADG junction having an n+ area connected to the output terminal; a first ADG gate having an n+ polysilicon area connected to input1 terminal; and a second ADG gate having a p+ polysilicon area connected to input2 terminal. Preferably, the SDG load structure and the ADG load structure are constructed to satisfy an SDG load inverter ratio. Further, a load capacitor may be connected between the ground terminal and the output terminal. Both the ADG driver structure and the SDG load structure may be fabricated on the same substrate, may have buried gates, and may be fabricated using a dual poly process.

In yet a further aspect of the invention, an n input NOR circuit is disclosed which includes a multitude of terminals, an SDG load structure, and n/2 ADG driver structures. The terminals may include n input terminals; an output terminal; a supply voltage terminal; and a ground terminal. The SDG load structure may include a first SDG junction having an n+ area connected to the supply voltage terminal; a second SDG junction having an n+ area connected to the output terminal; an first SDG gate having an n+ polysilicon area connected to the output terminal; and a second SDG gate having an n+ polysilicon area connected to the output terminal. Each of the n/2 ADG driver structures may include a first ADG junction having an n+ area connected to the ground terminal; a second ADG junction having an n+ area connected to the output terminal; a first ADG gate having an n+ polysilicon area connected to one of the input terminals; and a second ADG gate having a p+ polysilicon area connected to another of the input terminals. Preferably, at least one of the n/2 ADG driver structures and the SDG load structure are constructed to satisfy an SDG load inverter ratio. Further, a load capacitor may be connected between the ground terminal and the output terminal. Both the n/2 ADG driver structures and the SDG load structure may be fabricated on the same substrate, may have buried gates, and may be fabricated using a dual poly process.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated in and form a part of the specification, illustrate an embodiment of the present invention and, together with the description, serve to explain the principles of the invention.

DETAILED DESCRIPTION OF THE INVENTION

The present invention is an SOI Logic family composed of an intrinsically on symmetric fully depleted double gate MOSFET load and an asymmetric fully depleted double gate MOSFETs as the drivers.

This invention may provide a high speed low power logic family for double gate SOI technology. The basic element of the digital circuit is the digital inverter, which provides a digital output signal that is the digital complement of the input. For example, if the input is "HIGH," then the output is "LOW," and vice versa. There are certain parameters for a digital inverter that may make it more robust and a better design. The parameters includes a noise margin, which should be high, a threshold voltage, and load current characteristics vs. output voltage.

Figure 3:
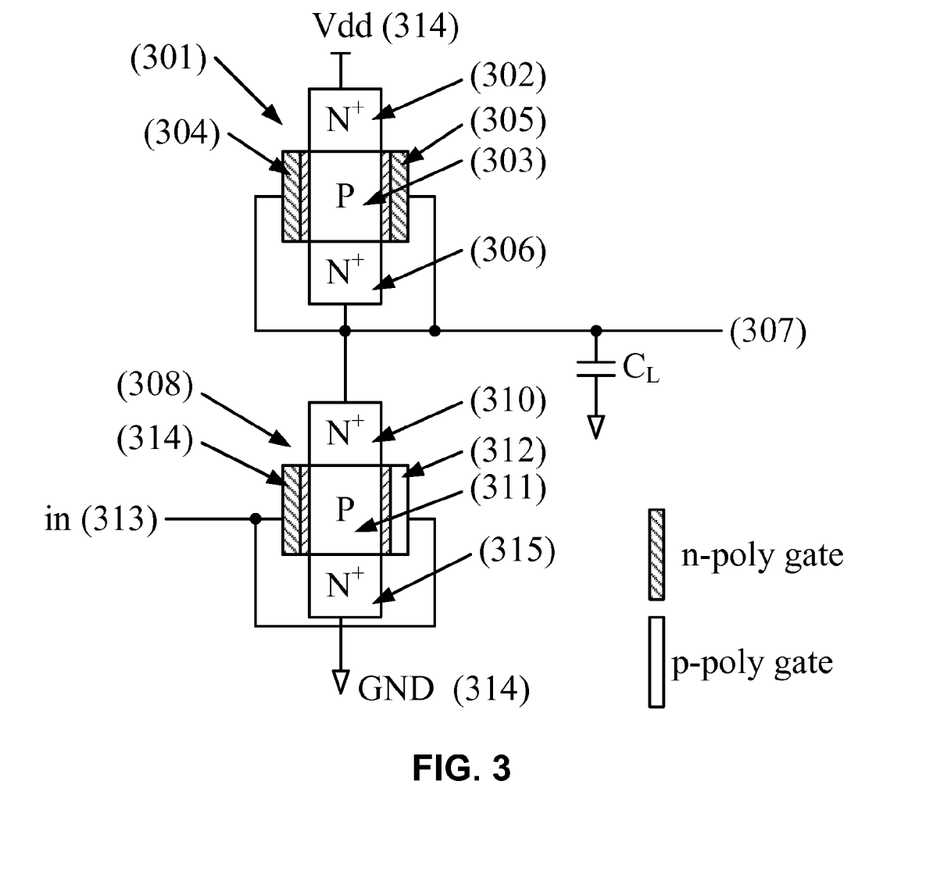
FIG. 3 shows a block diagram of a basic inverter circuit comprising a Symmetric Double Gate (SDG) SOI load nMOSEFT and an Asymmetric Double Gate (ADG) SOI driver nMOSFET as per an aspect of an embodiment of the present invention.

A best mode practice for the ratioed SOI inverter with FD symmetric DG-MOSFET load will now be explained. Referring to FIG. 3, we see an illustrative example of the present invention. Load transistor 301 is a double gate NMOS transistor with the front 304 and the back 305 gates preferably formed of the same n+ poly material. The gates are connected together and connected to output node 307. The driver transistor 308 is a double gate NMOS transistor with a front gate 312 constructed of p+ material and a back gate 314 constructed of n+ material. These gates are connected together and connected to input node 313 of the inverter. The transistor may be formed of a single continuous diffusion. The doping of the transistor bodies 303 and 311 may be undoped or lightly p doped with a doping up to $10^{16}$ cm$^{-3}$. Having a lightly doped body preferably helps increase mobility, reduce short channel effects, and increase the reliability of the device. The sources 302 and 315 and the drains 306 and 310 of the transistors are highly n doped with doping levels in the range of $10^{20}$–$10^{21}$ cm$^{-3}$. For the specified body doping the Si film thickness should be up to 15 nm. The front gates 304 and 312, as well as the back gates 305 and 314, should have an ultra-thin oxide thickness ($t_{oxf}$ and $t_{oxb}$) up to 3 nm. The lengths of the front and back gates of the two transistors may be up to 50 nm. The symmetric DG NMOS transistor 301 should be smaller than the asymmetric DG NMOS transistor 308 so that the D.C. power dissipation will not be high and the noise margin for the low output will be not be low. A preferred ratio size has the width of the symmetric transistor approximately half the width of the asymmetric transistor.

Figure 4:
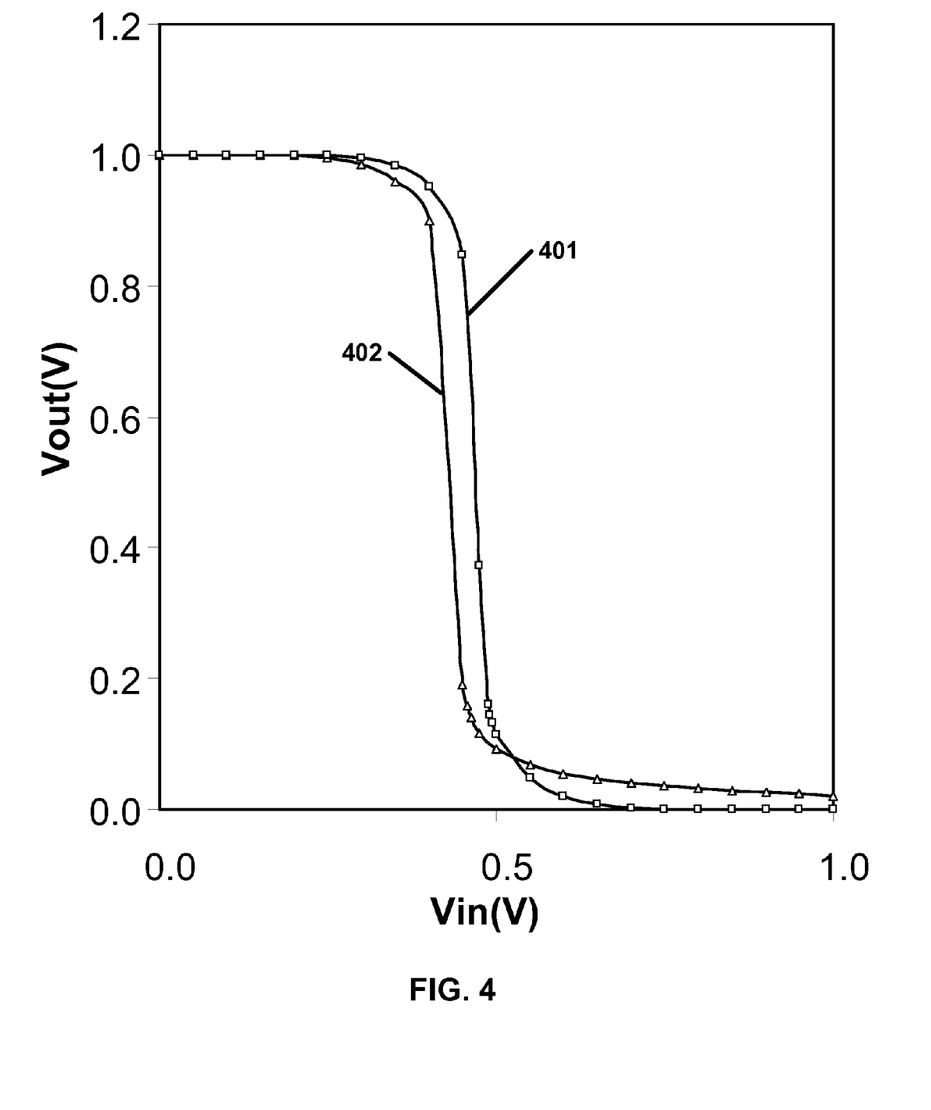
FIG. 4 shows voltage transfer characteristics for the basic inverter structure shown in FIG. 1 in comparison with an equivalent regular CMOS based DG inverter.

FIG. 4 shows voltage transfer characteristics (VTC) of a double gate inverter shown in FIG. 1 in comparison with an equivalent regular CMOS based DG inverter. These results are based on a simulation of the device of the structure. The simulation parameters used were: $V_{DD}$=1V; $t_{oxf}$=$t_{oxb}$=3 nm; channel thickness tsi=10 nm; undoped (intrinsic) channel; degenerate source/drain. Line 401 represents the SDG CMOS load inverter and line 402 represents the ADG inverter. The SDG load inverter ratio may be represented by $(W/L)_{SDG}/(W/L)_{ADG}$=1:2, where W is the width of a gate and L is the length of a gate. Similarly, the SDG CMOS load inverter ratio may be represented by $(W/L)_N/(W/L)_P$=1:2. One skilled in the art will recognize that these values may vary without deviating from the scope of the invention. For example, although ratio values of 1:2 have been identified for the presently described best mode, it is anticipated that other ratio values that produce useful characteristics worthy of practice may be identified for this and other embodiments.

Figure 5:
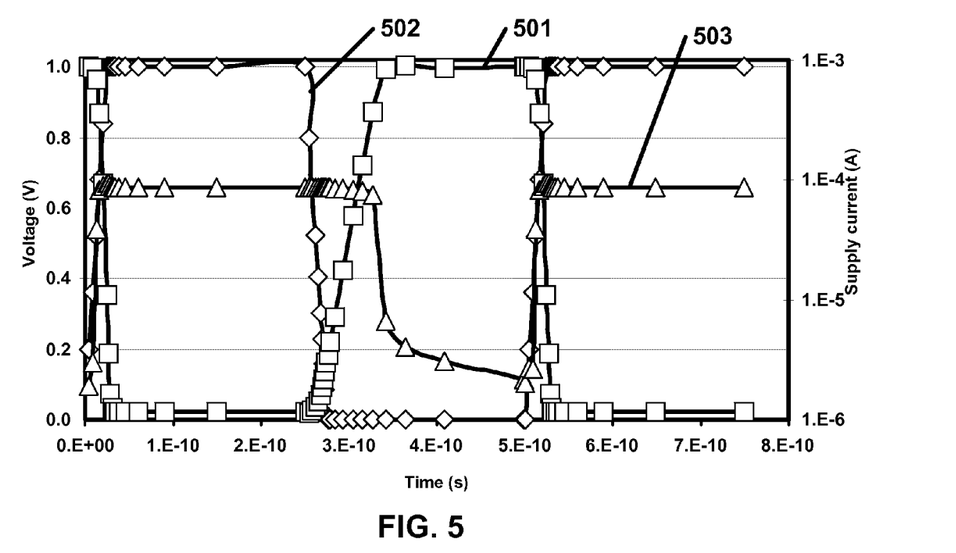
FIG. 5 shows the transient voltage and drive current characteristics for the basic inverter structure shown in FIG. 3.

FIG. 5 shows the transient voltage and drive current characteristics for the basic inverter structure shown in FIG. 1 with a load capacitor connected. In this plot, the inverter operation is pulse stimulated. The output voltage 501 is the inverted version of the input voltage 502. Note that the maximum value of the supply current 503 is not that high indicating that the static current is not the main reason for power dissipation as the dynamic power increases at high frequencies approaching 2 GHz.

Figure 6:
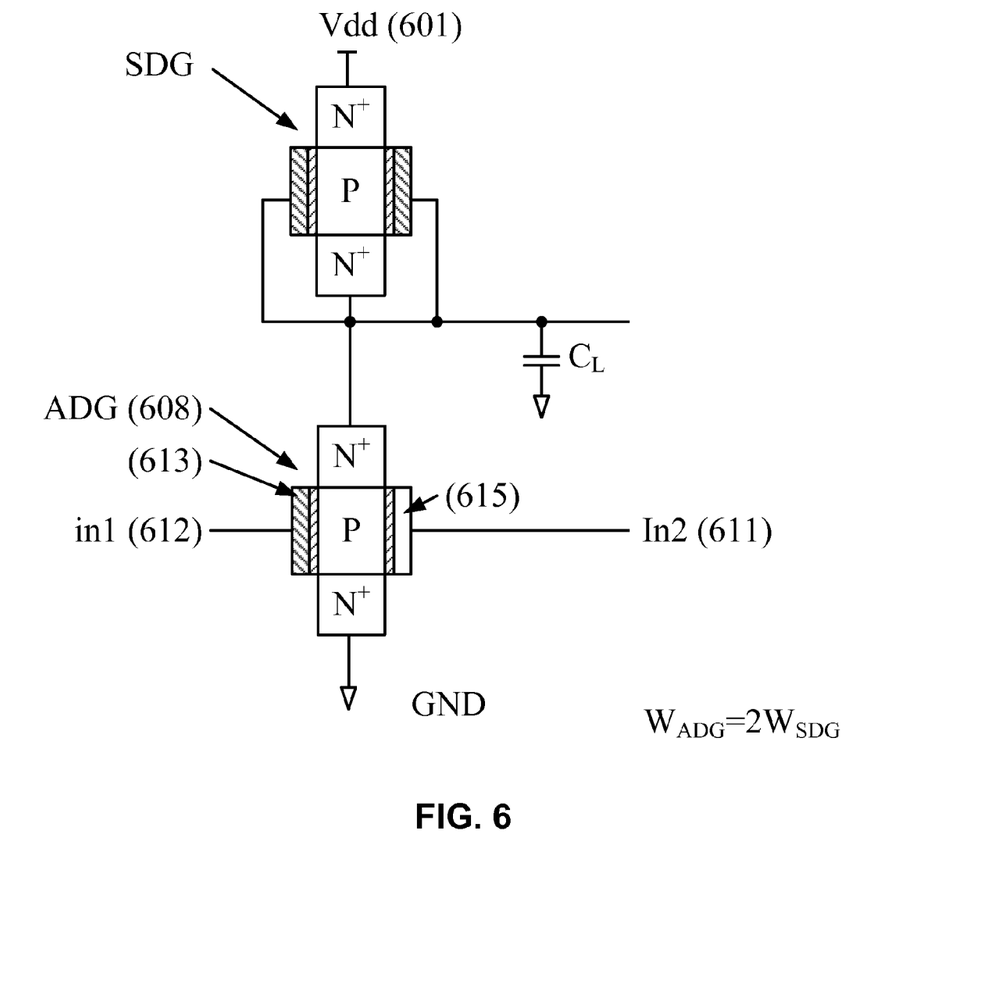
FIG. 6 shows a block diagram of a two input NOR gate as per an aspect of an embodiment of the present invention.

FIG. 6 shows a block diagram of a two input NOR gate as per an aspect of an embodiment of the present invention. This two input NOR gate (NOR2) uses the basic inverter structure described in FIG. 1. To achieve a NOR2 operation, one gate of the ADG nMOSFET driver should form one input while the other gate should drive the other input. Specifically, the expansion of the inverter circuit to a NOR2 circuit may be achieved by decoupling the front gate 613 and back gate 615 of the asymmetric transistor 608, and connecting inputs 611 and 612 each to one of the gates of the asymmetric transistor 608. The design of the transistors to operate as a NOR gate follows the same basic design as the inverter mentioned above. The main difference is in the width ratio. Unlike the inverter in which one gate is "ON" most of the time during the operation, the width of the symmetric transistor in the NOR circuit is preferably "ON" one quarter of the time of the asymmetric transistor for better performance. The described logic gates may be better when used at high frequencies (>1 GHz), where their performance may exceed normal CMOS circuits. The NOR circuits may be extended to more than two inputs by adding more transistors in parallel.

Figure 7:
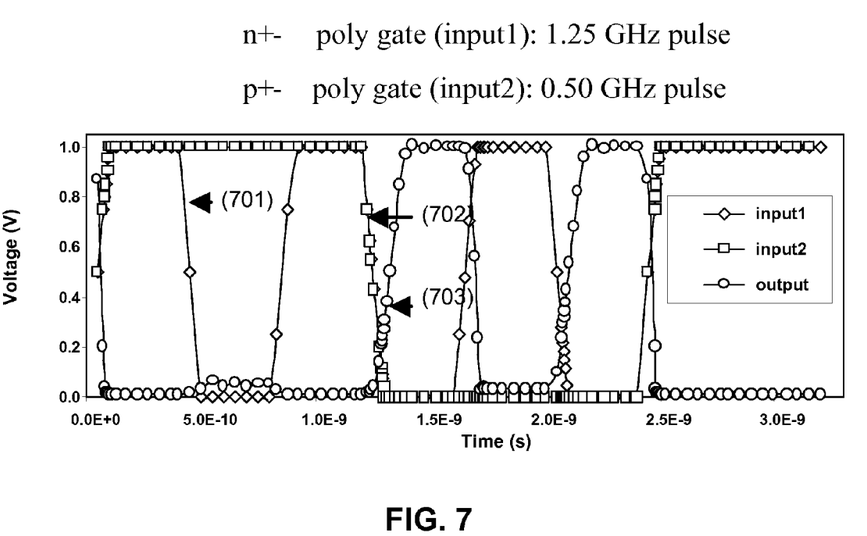
FIG. 7 shows the transient voltage and drive current characteristics for the two input NOR gate shown in FIG. 6.

FIG. 7 shows transient voltage and drive current characteristics for the basic inverter structure shown in FIG. 6. The output 703 is the result of the logic NOR operation of the input 701 and input 702.

NAND and XOR gates will now be disclosed that extend this logic family of ratioed logic where an SDG device is used as the load, and an ADG devices are used as drivers.

Figure 8:
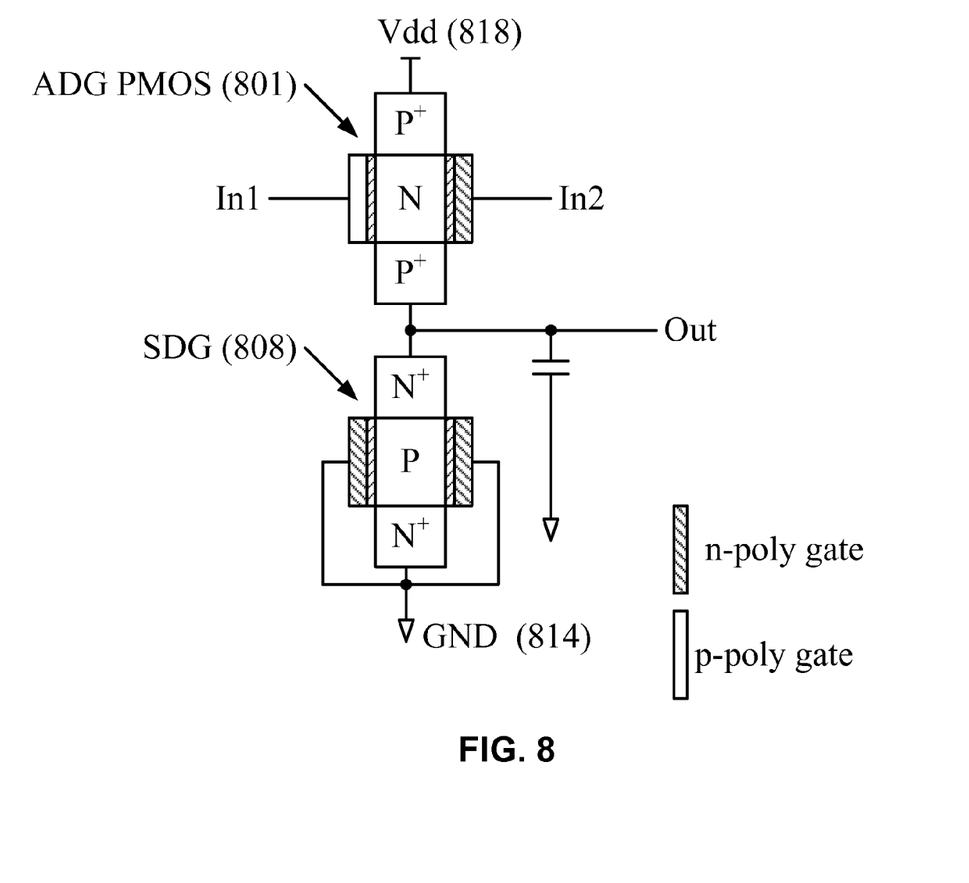
FIG. 8 shows a block diagram of a NAND2 gate as per an aspect of an embodiment of the present invention.
Figure 9:
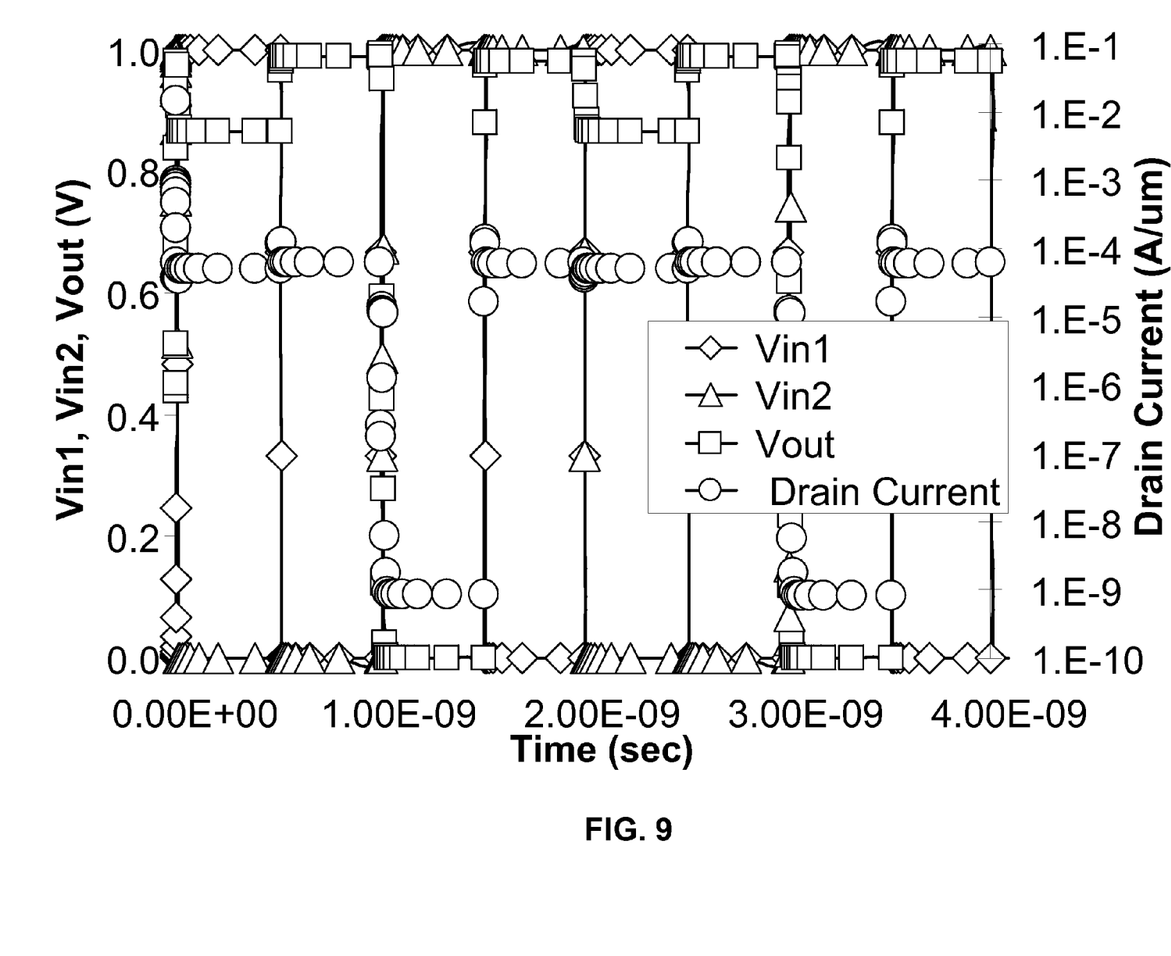
FIG. 9 shows the transient voltage and drive current characteristics for the NAND2 gate shown in FIG. 8.

Two different ways to implement a NAND circuit using DG based ratioed logic will now be disclosed. FIG. 8 shows the first type of NAND circuit: the "driver" device is an ADG PMOS 801 connected to VDD 818 and the load is an (intrinsically on) SDG device 808 connected to GND 814. This represents an extension of the previous NOR2 structure by using the complementary nature of pull-up and pull-down operation in conventional CMOS gates. FIG. 9 shows the corresponding output voltage and drive current transients, for $(W/L)_{ADG}$:$(W/L)_{SDG}$=15:1 and inputs of 1 GHz pulse on the $p^+$-poly gate and a 0.5 GHz on the n+-poly gate. According to this result, when the backgate ($n^+$ poly) is on (1V) and the frontgate ($p^+$ poly) of the PMOS is off (0V), the output reaches 0.85 of VDD, a lower voltage compared to the cases where with both gates on (00) or front gate on and backgate off (01), the output reaches VDD. This can be corrected by increasing the PMOS size to compensate for the discharging NMOS pull-down, which also reduces the leakage current.

Figure 10:
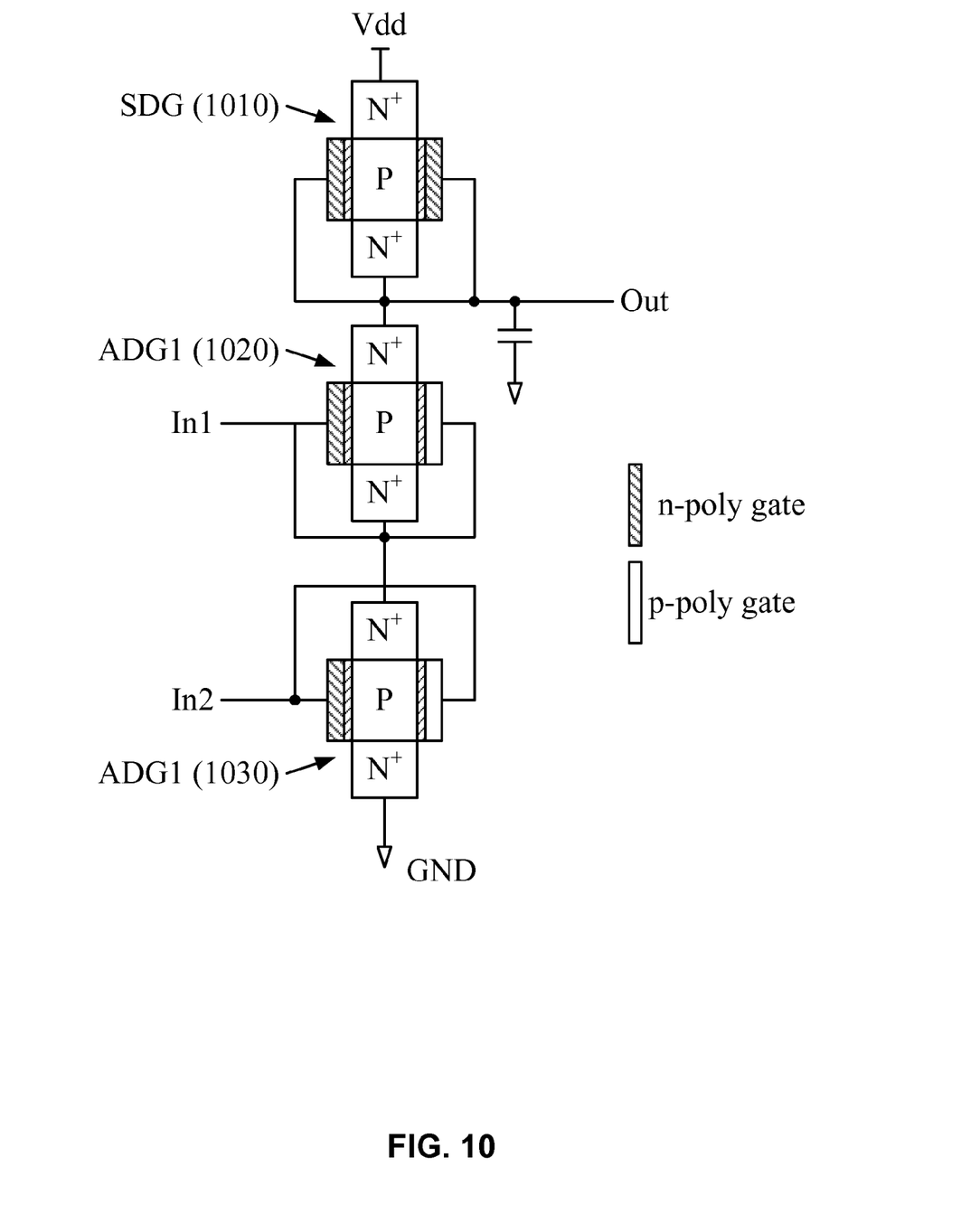
FIG. 10 shows a block diagram of a NAND2 gate as per an aspect of an embodiment of the present invention.
Figure 11:
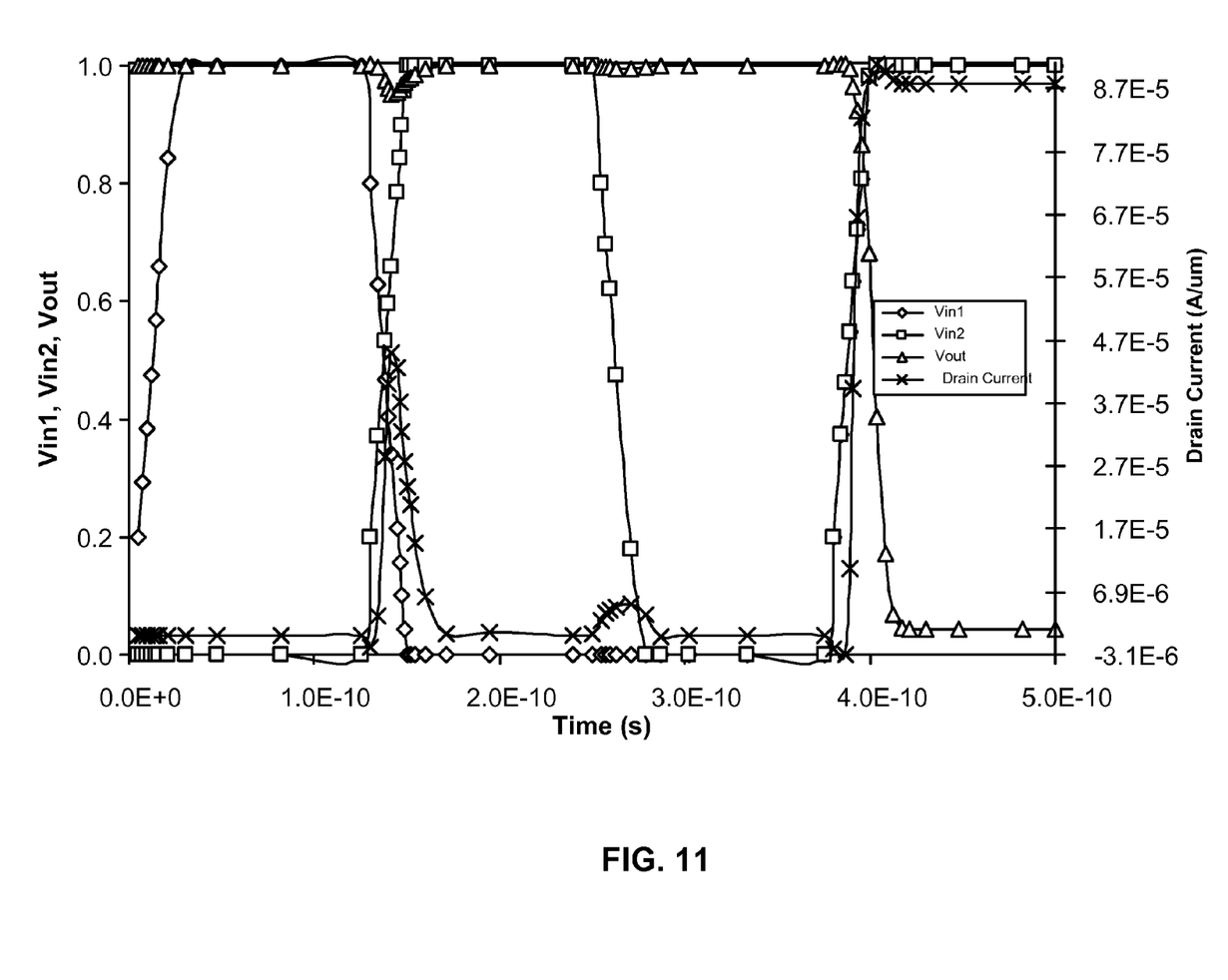
FIG. 11 shows the transient voltage and drive current characteristics for the NAND2 gate shown in FIG. 10.

The second NAND2 circuit is shown in FIG. 10, where an SDG load 1001 is connected to an N-pull-down tree with two ADG NMOS drivers 1020 and 1030 (with $W_{ADG}$=2$W_{SDG}$) connected in series, and where the two gates of each ADG device are tied together. The transient output voltage and driver current characteristics of this NAND2 gate for both inputs driven by 3.64 GHz pulses is shown in FIG. 11. Advantageously, the fabrication of this structure may require only one (continuous) diffusion, but may need one more device to achieve the NAND operation. As is common in ratioed logic, it exhibits a non-zero LOW output signal, whereas the previous NAND2 (FIG. 8) exhibits a (complementary) non VDD HIGH, because here the active load is the pull-down device. This may actually offer more flexibility to a circuit designer to choose between these two structures according to needs and constraints.

Figure 12:
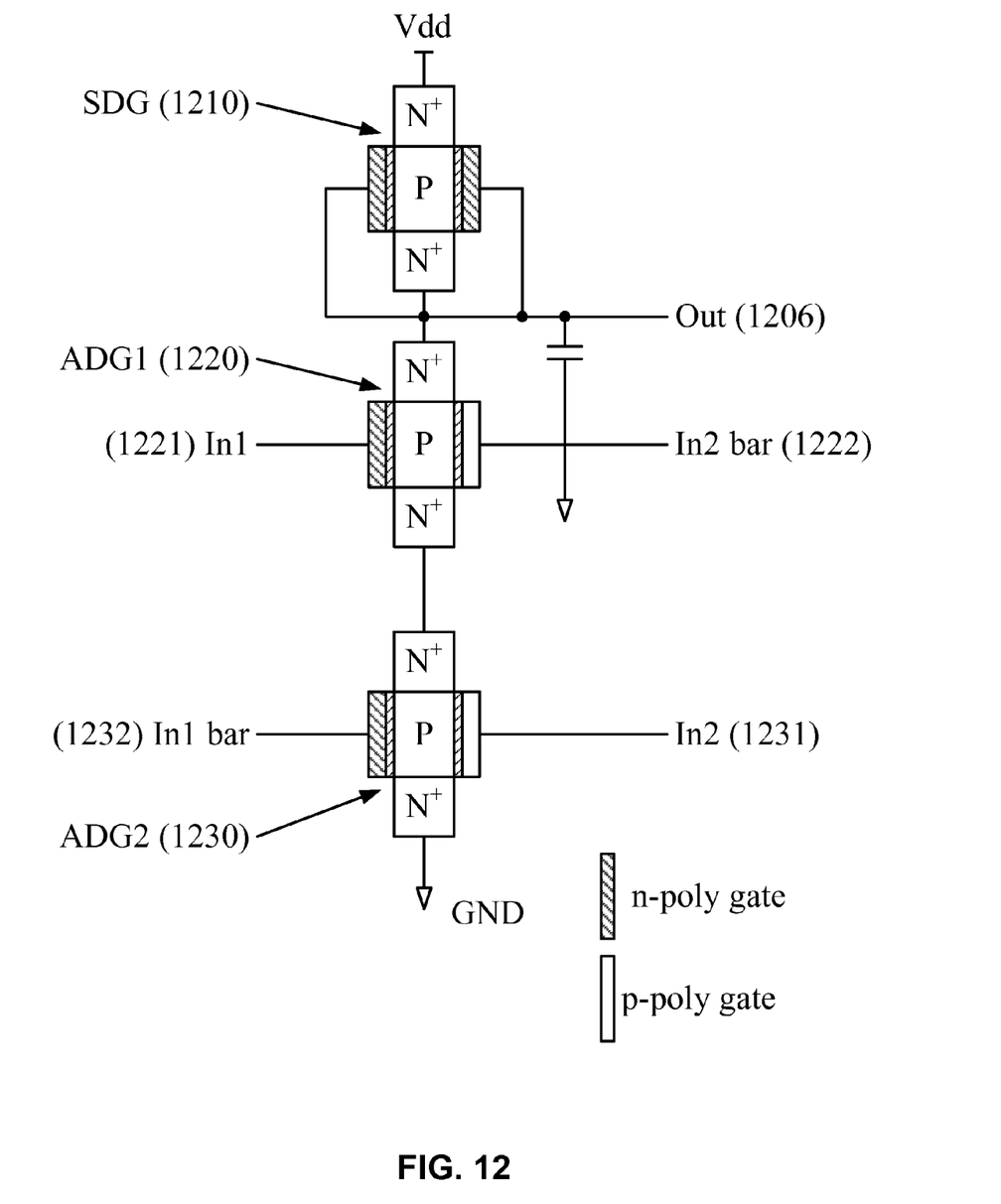
FIG. 12 shows a block diagram of a XOR2 gate as per an aspect of an embodiment of the present invention.
Figure 13:
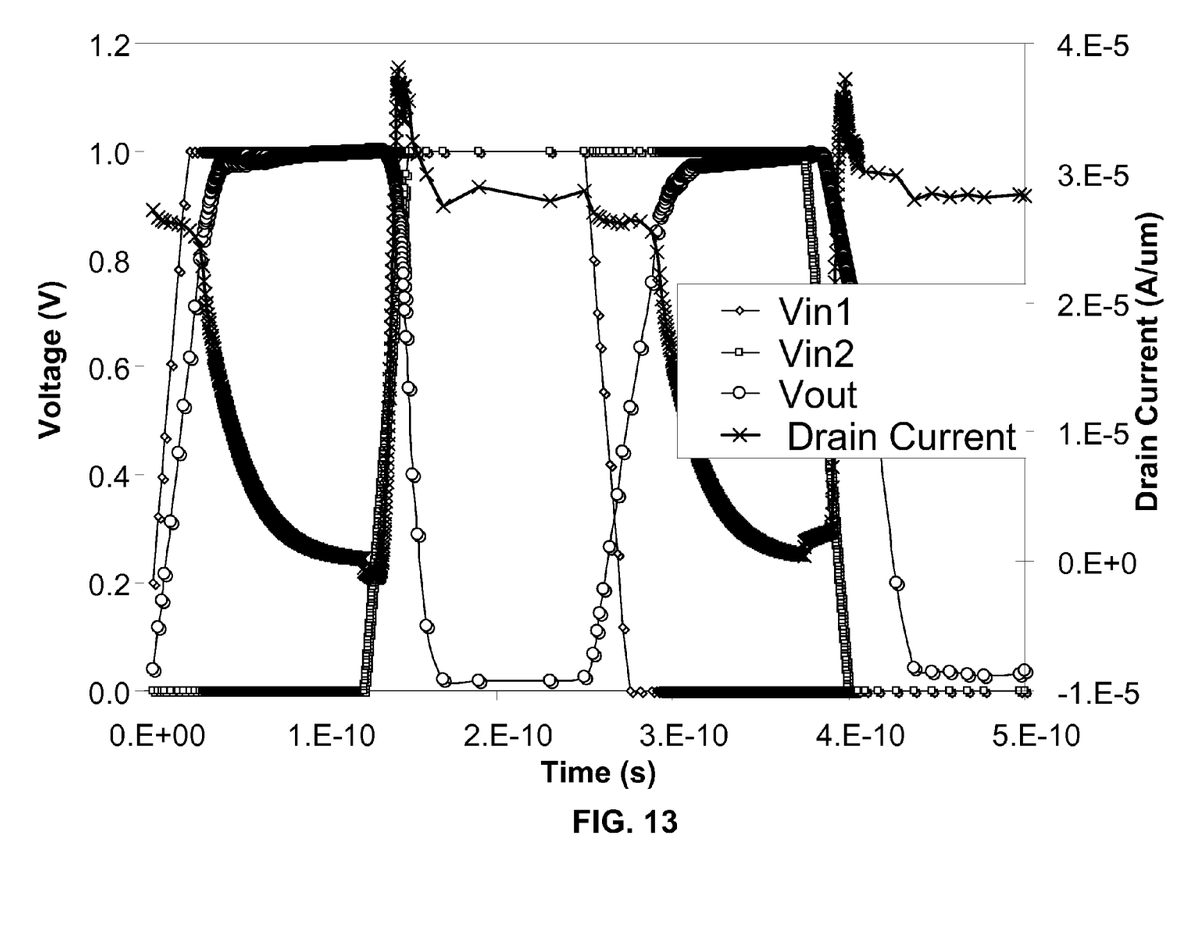
FIG. 13 shows the transient voltage and drive current characteristics for the XOR2 gate shown in FIG. 12.

The present invention may be used to construct an XOR gate using only two driver transistors, which is impossible in normal (classical) CMOS logic. An embodiment of an XOR gate according to the present invention is shown in FIG. 12 and has the same base structure as the NAND2 gate shown in FIG. 10. The XOR operation is possible when each asymmetric transistor 1220 and 1230 has one input 1221 and 1231 and the complement of the other input 1222 and 1232 as the two gate voltages. Therefore, the subtlety lies in the selection of the gate bias and gate-material. The working set of inputs and gate material combination may be unique and is shown in FIG. 12. Let us consider the (10) and (01) case. These two conditions should be identical and the current would pass through the lower transistor. As the channel connected to n-poly makes a stronger turn on, hence higher current, compared to the one connected to p-poly. This complementary and opposite input configuration preferably averages out both the (10) and (01) condition and produces an identical high output. Also, for (00) and (11), one may need to get the same low output. In this case, the gate configuration may stop the current from passing through the lower transistor so that an identical low voltage can be achieved at the output. Besides the appropriate gate materials and input bias combination conditions, proper sizing of the transistors may be mandatory to achieve optimum operation. Another interesting feature of this design is that the same style can be used for both XOR and NAND operation with a proper bias and gate material combination. Here, the XOR operation may be achieved with $(W/L)_{SDG}:(W/L)_{ADG1}:(W/L)_{ADG2}=1:8:8$. A typical transient for output voltage and drive current for an XOR operation is shown in FIG. 13 with two inputs of 3.64 GHz and 2.0 GHz, respectively. Also note that these structures (with either a static load pull-up like FIG. 12 or pull-down like FIG. 8) can be further extended to other logic gates such as AOI and OAI, and to larger gates such as NOR4 or NAND4, where one only needs to add an additional parallel device for an additional 2 inputs (if a proper device sizing is used).

Disclosed is a novel SOI FD DG logic inverter and NOR gates that may be used for low power low voltage operation. These devices may have minimal capacitance and use a smaller amount of real estate than comparable CMOS devices. An area reduction of around 50% may be expected over the traditional CMOS circuits. Additionally, two basic gates (NAND and XOR) have been disclosed which use the unique ratioed logic based approach with SDG SOI loads and ADG drivers. Together, these logic elements form a complete set of working gates, with interesting advantages and some design flexibility. It is envisioned that all of the disclosed gate topologies presented may be further improved with clocked loads to reduce power dissipation and improve signal integrity.

The foregoing descriptions of the preferred embodiments of the present invention have been presented for purposes of illustration and description. They are not intended to be exhaustive or to limit the invention to the precise forms disclosed, and obviously many modifications and variations are possible in light of the above teaching. The illustrated embodiments were chosen and described in order to best explain the principles of the invention and its practical application to thereby enable others skilled in the art to best utilize the invention in various embodiments and with various modifications as are suited to the particular use contemplated.

What is claimed is:

1. An SOI MOSFET inverter comprising:
   a) a multitude of terminals including:
      i) an input terminal;
      ii) an output terminal;
      iii) a supply voltage terminal; and
      iv) a ground terminal;
   b) an SDG load structure including:
      i) a first SDG junction having an n+ area connected to said supply voltage terminal;
      ii) a second SDG junction having an n+ area connected to said output terminal;
      iii) a first SDG gate having an n+ polysilicon area connected to said output terminal; and
      iv) a second SDG gate having an n+ polysilicon area connected to said output terminal; and
   c) an ADG load structure including:
      i) a first ADG junction having an n+ area connected to said ground terminal;
      ii) a second ADG junction having an n+ area connected to said output terminal;
      iii) a first ADG gate having an n+ polysilicon area connected to said input terminal; and
      iv) a second ADG gate having an p+ polysilicon area connected to said input terminal.

2. A system according to claim 1, wherein said SDG load structure and said ADG load structure are constructed to satisfy an SDG load inverter ratio.

3. A system according to claim 1, further including a load capacitor connected between said ground terminal and said output terminal.

4. A system according to claim 1, wherein said ADG driver structure and said SDG load structure are fabricated on the same substrate.

5. A system according to claim 1, wherein said ADG driver structure and said SDG load structure have buried gates.

6. A system according to claim 1, wherein said ADG driver structure and said SDG load structure are fabricated using a dual poly process.

7. A two input SOI MOSFET NOR circuit comprising:
   a) a multitude of terminals including:
      i) a first input terminal;
      ii) a second input terminal;
      iii) an output terminal;
      iv) a supply voltage terminal; and
      v) a ground terminal;
   b) an SDG load structure including:
      i) a first SDG junction having an n+ area connected to said supply voltage terminal;
      ii) a second SDG junction having an n+ area connected to said output terminal;
      iii) a first SDG gate having an n+ polysilicon area connected to said output terminal; and
      iv) a second SDG gate having an n+ polysilicon area connected to said output terminal; and
   c) an ADG load structure including:
      i) a first ADG junction having an n+ area connected to said ground terminal;
      ii) a second ADG junction having an n+ area connected to said output terminal;
      iii) a first ADG gate having an n+ polysilicon area connected to said input1 terminal; and
      iv) a second ADG gate having an p+ polysilicon area connected to said input2 terminal.

8. A system according to claim 7, wherein said SDG load structure and said ADG load structure are constructed to satisfy an SDG load inverter ratio.

9. A system according to claim 7, further including a load capacitor connected between said ground terminal and said output terminal.

10. A system according to claim 7, wherein said ADG driver structure and said SDG load structure are fabricated on the same substrate.

11. A system according to claim 7, wherein said ADG driver structure and said SDG load structure have buried gates.

12. A system according to claim 7, wherein said ADG driver structure and said SDG load structure are fabricated using a dual poly process.

13. An n input SOI MOSFET NOR circuit comprising:
a) a multitude of terminals including:
  i) n input terminals;
  ii) an output terminal;
  iii) a supply voltage terminal; and
  iv) a ground terminal;
b) an SDG load structure including:
  i) a first SDG junction having an n+ area connected to said supply voltage terminal;
  ii) a second SDG junction having an n+ area connected to said output terminal;
  iii) a first SDG gate having an n+ polysilicon area connected to said output terminal; and
  iv) a second SDG gate having an n+ polysilicon area connected to said output terminal; and
c) n/2 ADG load structures, each of said ADG load structures including:
  i) a first ADG junction having an n+ area connected to said ground terminal;
  ii) a second ADG junction having an n+ area connected to said output terminal;
  iii) a first ADG gate having an n+ polysilicon area connected to one of said input terminals; and
  iv) a second ADG gate having an p+ polysilicon area connected to another of said input terminals.

14. A system according to claim 13, wherein said SDG load structure and at least one of said n/2 ADG load structures are constructed to satisfy an SDG load inverter ratio.

15. A system according to claim 13, further including a load capacitor connected between said ground terminal and said output terminal.

16. A system according to claim 13, wherein said n/2 ADG driver structures and said SDG load structure are fabricated on the same substrate.

17. A system according to claim 13, wherein said n/2 ADG driver structures and said SDG load structure have buried gates.

18. A system according to claim 13, wherein said n/2 ADG driver structure and said SDG load structure are fabricated using a dual poly process.

19. An SOI MOSFET NAND gate comprising:
a) a multitude of terminals including:
  i) a first input terminal;
  ii) a second input terminal;
  iii) an output terminal;
  iv) a supply voltage terminal; and
  v) a ground terminal;
b) an ADG load structure including:
  i) a first ADG junction having a p+ area connected to said supply voltage terminal;
  ii) a second ADG junction having a p+ area connected to said output terminal;
  iii) a first ADG gate having a p+ polysilicon area connected to said first input terminal; and
  iv) a second SDG gate having an n+ polysilicon area connected to said second input terminal; and
c) an SDG load structure including:
  i) a first SDG junction having an n+ area connected to said ground terminal;
  ii) a second SDG junction having an n+ area connected to said output terminal;
  iii) a first SDG gate having an n+ polysilicon area connected to said ground terminal; and
  iv) a second SDG gate having an n+ polysilicon area connected to said ground terminal.

20. An SOI MOSFET NAND gate comprising:
a) a multitude of terminals including:
  i) a first input terminal;
  ii) a second input terminal;
  iii) an output terminal;
  iv) a supply voltage terminal; and
  v) a ground terminal;
b) an SDG load structure including:
  i) a first SDG junction having an n+ area connected to said supply voltage terminal;
  ii) a second SDG junction having an n+ area connected to said output terminal;
  iii) a first SDG gate having an n+ polysilicon area connected to said output terminal; and
  iv) a second SDG gate having an n+ polysilicon area connected to said output terminal;
c) a first ADG load structure including:
  i) a first ADG junction having an n+ area connected to said second SDG terminal;
  ii) a second ADG junction having an n+ area connected to said first input terminal;
  iii) a first ADG gate having an n+ polysilicon area connected to said first input terminal; and
  iv) a second ADG gate having an p+ polysilicon area connected to said first input terminal; and
d) a second ADG load structure including:
  i) a third ADG junction having an n+ area connected to said first input terminal;
  ii) a fourth ADG junction having an n+ area connected to said ground terminal;
  iii) a third ADG gate having an n+ polysilicon area connected to said second input terminal; and
  iv) a fourth ADG gate having an p+ polysilicon area connected to said second input terminal.

21. An SOI MOSFET XOR gate comprising:
a) a multitude of terminals including:
  i) a first input terminal;
  ii) a first bar input terminal;
  iii) a second input terminal;
  iv) a second bar input terminal;
  v) an output terminal;
  vi) a supply voltage terminal; and
  vii) a ground terminal;
b) an SDG load structure including:
  i) a first SDG junction having an n+ area connected to said supply voltage terminal;
  ii) a second SDG junction having an n+ area connected to said output terminal;
  iii) a first SDG gate having an n+ polysilicon area connected to said output terminal; and
  iv) a second SDG gate having an n+ polysilicon area connected to said output terminal;
c) a first ADG load structure including:
  i) a first ADG junction having an n+ area connected to said second SDG terminal;
  ii) a second ADG junction having an n+ area;
  iii) a first ADG gate having an n+ polysilicon area connected to said first input terminal; and iv) a second ADG gate having an p+ polysilicon area connected to said second bar input terminal; and d) a second ADG load structure including:
  i) a third ADG junction having an n+ area connected to said second ADG junction;
  ii) a fourth ADG junction having an n+ area connected to said ground terminal;
  iii) a third ADG gate having an n+ polysilicon area connected to said first bar input terminal; and
  iv) a fourth ADG gate having an p+ polysilicon area connected to said second input terminal.

* * * * *